(12) United States Patent
Zhang et al.

(10) Patent No.: US 10,666,015 B2
(45) Date of Patent: May 26, 2020

(54) LASER ARRAY BEAM COMBINATION DEVICE

(71) Applicant: II-VI Suwtech, Inc., Shanghai (CN)

(72) Inventors: Shaofeng Zhang, Shanghai (CN); Dashan Li, Shanghai (CN); Jintao Yang, Shanghai (CN); Leo Shen, Shanghai (CN); Xiaobin Sun, Shanghai (CN)

(73) Assignee: II-VI Suwtech, Inc., Shanghai (CN)

( * ) Notice: Subject to any disclaimer, the term of this patent is extended or adjusted under 35 U.S.C. 154(b) by 0 days.

(21) Appl. No.: 16/315,694

(22) PCT Filed: Dec. 23, 2016

(86) PCT No.: PCT/CN2016/111709
§ 371 (c)(1),
(2) Date: Jan. 7, 2019

(87) PCT Pub. No.: WO2018/006559
PCT Pub. Date: Jan. 11, 2018

(65) Prior Publication Data
US 2019/0214785 A1    Jul. 11, 2019

(30) Foreign Application Priority Data

Jul. 6, 2016   (CN) .......................... 2016 1 0528261

(51) Int. Cl.
*H01S 5/14*   (2006.01)
*H01S 5/40*   (2006.01)
(Continued)

(52) U.S. Cl.
CPC .......... *H01S 5/141* (2013.01); *G02B 27/0955* (2013.01); *H01S 5/4012* (2013.01);
(Continued)

(58) Field of Classification Search
CPC .......... H01S 5/42; H01S 5/141; H01S 5/4012; G02B 27/0955
See application file for complete search history.

(56) References Cited

U.S. PATENT DOCUMENTS 6,529,542 B1    3/2003  Karlsen et al.
6,665,471 B1 *  12/2003 Farmer ................. H01S 5/4062
                                                        372/102
(Continued)

FOREIGN PATENT DOCUMENTS

CN    104134930 A    11/2014
CN    105932545 A     9/2016

OTHER PUBLICATIONS

The ISR issued by WIPO dated Mar. 31, 2017.

*Primary Examiner* — Tuan N Nguyen
(74) *Attorney, Agent, or Firm* — Yunling Ren

(57) ABSTRACT

A laser array combining device, which comprises: a laser gain medium array, comprising at least two laser gain units, and each generates a laser beam; a shaping optical system, optical shaping to the laser beams generated by the laser gain medium array, the shaping optical system comprises: a fast axis collimating lens, arranged at an emergent side of the laser gain medium array; a field flattening lens, arranged at an emergent side of the fast axis collimating lens, correcting the field curvature of the shaping optical system; a negative lens, arranged at an emergent side of the field flattening lens; a cylindrical lens, arranged at an emergent side of the negative lens for collimating the laser beams; a dispersing optical unit, arranged at an emergent side of the shaping optical system for diffracting incident laser beams; a partial reflection optical unit, receiving laser beams emitted by the dispersing optical unit.

8 Claims, 3 Drawing Sheets

(51) Int. Cl.
*G02B 27/09* (2006.01)
*H01S 5/42* (2006.01)

(52) U.S. Cl.
CPC .............. *H01S 5/4062* (2013.01); *H01S 5/42* (2013.01); *H01S 5/143* (2013.01); *H01S 5/4087* (2013.01)

(56) References Cited

U.S. PATENT DOCUMENTS

| | | | |
|---|---|---|---|
| 6,952,510 B1 * | 10/2005 | Karlsen | G02B 27/0955 385/31 |
| 7,065,107 B2 | 6/2006 | Hamilton et al. | |
| 2003/0058916 A1 * | 3/2003 | Tanaka | B23K 26/0604 372/101 |
| 2009/0323752 A1 * | 12/2009 | Chuyanov | G02B 6/4206 372/50.12 |
| 2011/0305256 A1 * | 12/2011 | Chann | G02B 27/0905 372/75 |
| 2013/0077086 A1 * | 3/2013 | Chuang | G01N 21/9501 356/51 |
| 2013/0287058 A1 * | 10/2013 | Chann | H01S 3/0941 372/75 |

* cited by examiner

LASER ARRAY BEAM COMBINATION DEVICE

TECHNICAL FIELD

The present invention relates to the field of laser device, especially a semiconductor laser array device with an external cavity for beam combination.

BACKGROUND

Compared to other types of laser devices, semiconductor laser devices have many characteristics, such as high conversion efficiency, small volume, light weight, long lifetime, capable of direct modulation, liable to integrate with other semiconductor devices and so on. Such low power semiconductor laser devices have been widely used as information carrier in optical communication, optical storage, laser printing and other information fields. However, with the limits of wave guiding structure, chip packaging and other factors which leads poor beam quality and low power density, semiconductor laser devices are hard to be used as a direct optical source to apply for industrial process.

Recently, as the development of the semiconductor laser device technology, and under the promotion driving by the application of direct semiconductor laser industrial processing and the pumping demand of high-power optical fiber laser device, the semiconductor laser devices with high power and high beam quality develops rapidly. At the same time, the laser beam combining technology makes laser power increased multiply in the past few years. Nowadays, the power levels of optical fiber laser devices and direct semiconductor laser devices adopting beam combining technology have reached kilowatt stage.

Nowadays, the main methods of beam combination of semiconductor laser devices are coherent beam combination and incoherent beam combination. Coherent beam combination can effectively improve and increase the beam quality of output light of semiconductor laser array, but this technology is liable to be disturbed by external environment and it is hard to get a high-power stable output with same-phase and super-mode, and requires the beam combining array unit to be controlled strictly in many aspects, such as spectrum, phase position, amplitude, polarization state and so on. Thus, in the field of direct semiconductor laser device, incoherent technology is mainly employed.

Incoherent beam combination is used for making the output lasers of several laser devices transmit along a same direction to increase the power of laser multiply, wherein the power level is in direct proportion to the number of the laser devices. The incoherent technology comprises space beam combination, polarization beam combination and wavelength beam combination. Compared to coherent beam combination, incoherent beam combination has no requirements for phase position, spectrum, and amplitude, and is easy to be modulated, which is the main method of beam combination used in semiconductor laser devices nowadays. However, due to the restrictions brought by the mechanism of beam combination and the required optical devices, the above three incoherent beam combining methods all have certain defects, for example the beam quality and the luminance may not be improved effectively.

Space beam combination technology, such as introduced in U.S. Pat. No. 6,124,973 by Keming Du et al., which is used for stacking several semiconductor laser devices according to a certain spatial sequence to form a group of laser beams transmitting along a same direction, thereby to get high power laser output. As the space stacking cannot improve the beam quality, the resulting high-power laser output is generally and directly used in the occasions with lower beam quality requirements, such as serving as a pumping source of fiber laser device and the like.

Polarization beam combination technology mainly makes use of the polarization property of the laser device, to make two lasers with different polarization directions to combine and transmit along a same direction, such as introduced in the U.S. Pat. No. 8,427,749 by Jihua Du et al. Generally the polarization beam combination technology is used for making two laser beams or two laser beam combinations with mutually polarization directions to combine together, and is always used with other beam combination technologies.

Wavelength beam combination technology combines laser beams with different wavelengths by an optical unit such as a dichroscope, an optical grating and so on, which can increase power and luminance effectively, and is the main development direction of high-power direct semiconductor laser device nowadays. However, the present wavelength combination technology, no matter adopting a dichroscope, a volume Bragg grating or a diffraction grating, is always restricted by the spectrum, as different laser beams with different wavelengths are required to be independent from each other to keep enough wavelength intervals.

Antonio Sanchez-Rubio et al. from Lincoln Laboratory of Massachuarrangedts Institute of Technology put forward for the first time in the U.S. Pat. No. 6,192,062 that the grating-external cavity method can be used for realizing beam combination in external cavity as for semiconductor laser array or several fiber laser devices. After several decades research at home and abroad, the grating-external cavity spectrum beam combination (SBC) is proved to be the most effective beam combination technology to increase the beam quality of semiconductor laser and realize a high luminance output, and promotes the application in field of laser processing.

However, as for spectrum beam combination of the external cavity semiconductor laser array based on the U.S. Pat. No. 6,192,062 and similar technologies, the comprehensive consideration for the limits of diffraction grating dispersing ability, and the objects to increase beam quality and assure high enough efficiency etc, cause this type beam combining laser device to have wilder final output spectrum, longer whole light path and high requirement for precision adjustment and stability, which brings a certain inconvenience for the further development of the power of the direct output semiconductor laser device.

SUMMARY

In view of the defects of the existing technology, the object of the present invention is to provide a laser array beam combining device, which can shorten the whole optical path, lower the requirement for precision adjustment, increase the stability of the laser beam output, and improve the beam quality.

One aspect of the present invention provides a laser array combining device, the device comprises a laser gain medium array, a shaping optical system, a dispersing optical unit and a partial reflection optical unit; the laser gain medium array comprises at least two laser gain units, and each the laser gain unit generates a laser beam; the shaping optical system is used for optically shaping the laser beams generated by the laser gain medium array, the shaping optical system comprises a fast axis collimating lens, a field flattening lens, a negative lens and a cylindrical lens, the fast axis collimating lens is arranged at an emergent side of the laser gain medium array, the field flattening lens is arranged at an emergent side of the fast axis collimating lens, for correcting the field curvature of the shaping optical system, the negative lens is arranged at an emergent side of the field flattening lens, the cylindrical lens is arranged at an emergent side of the negative lens, used for collimating the laser beams; the dispersing optical unit is arranged at an emergent side of the shaping optical system, used for diffracting incident laser beams; and the partial reflection optical unit receives laser beams emitted by the dispersing optical unit.

The present invention discloses a laser array combining device, of which the shaping optical system comprises a fast axis collimator lens, a field flattening lens, a negative lens and a cylindrical lens, and can shorten the length of whole optical path, lower the requirement for precision adjustment of laser device, and increase the output stability of laser beams. The laser beams emitted out by the shaping optical system are refracted by a dispersing optical unit and then fed back by a partial reflection optical unit, so as to form a resonant cavity, and finally output combined beams, which improves the beam quality effectively.

DETAILED DESCRIPTION

According to the innovative spirit of present invention, the laser array combining device comprises: a laser gain medium array, the laser gain medium array comprises at least two laser gain units, and each the laser gain unit can generate a laser beam; a shaping optical system, for optically shaping the laser beams generated by the laser gain medium array, the shaping optical system comprises: a fast axis collimating lens, which is arranged at the emergent side of the laser gain medium array; a field flattening lens, which is arranged at the emergent side of the fast axis collimating lens, for correcting the field curvature of the shaping optical system; a negative lens, which is arranged at the emergent side of the field flattening lens; a cylindrical lens, which is arranged at the emergent side of the negative lens, for collimating the laser beams; a dispersing optical unit, which is arranged at the emergent side of the shaping optical system, for diffracting incident laser beams; a partial reflection optical unit, which receives the laser beams emitted by the dispersing optical unit.

Hereinafter, the technical contents of present invention will be further described with reference to the accompanying drawings and the embodiments as follows.

The First Embodiment

Figure 1:
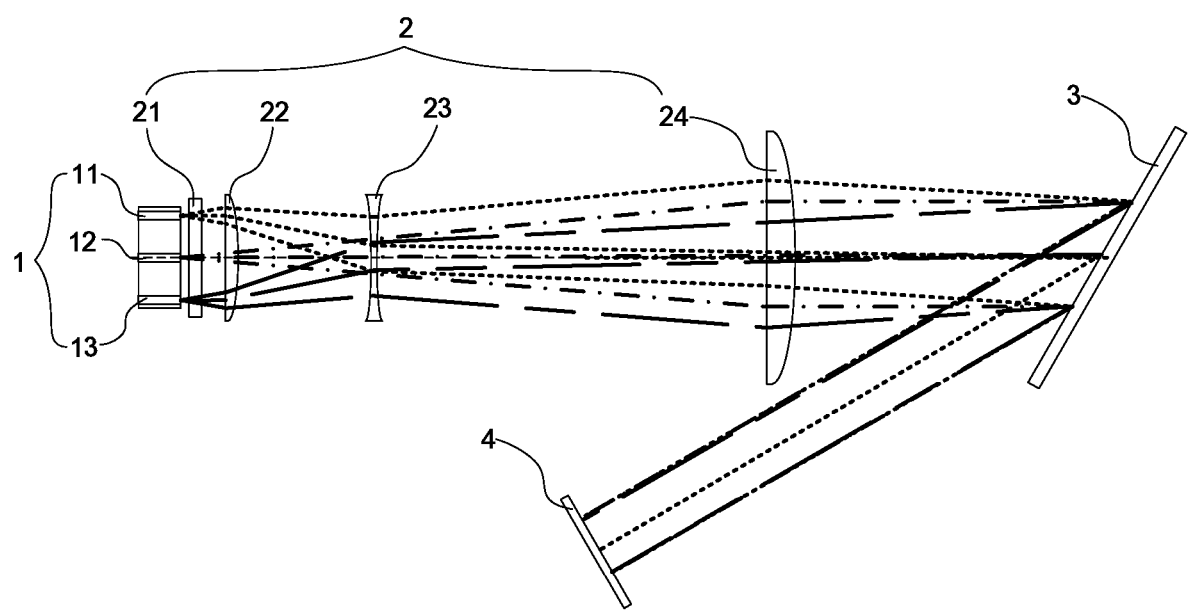
FIG. 1 is a structure schematic view of the laser array combining device according to a first embodiment of present invention.

Please refer to FIG. 1, which shows a structure schematic view of the laser array combining device according to the first embodiment of present invention. In the preferred embodiment shown in FIG. 1, the laser array beam combining device comprises: a laser gain medium array 1, a shaping optical system 2, a dispersing optical unit 3 and a partial reflection optical unit 4.

The laser gain medium array 1 comprises at least two laser gain units, and each the laser unit can generate a laser beam with a certain spectrum width. In the embodiment shown in FIG. 1, the laser gain medium array 1 is preferably a semiconductor laser device array. The laser gain medium array 1 comprises several laser gain units. It should be noted that, FIG. 1 only shows schematically a first laser gain unit 11, a second laser gain unit 12 and a third laser gain unit 13. In the laser gain medium array 1, the spectrums of laser beams generated by two adjacent the laser gain units are overlapped partially. For example, in the embodiment shown in FIG. 1, the spectrums of laser beams generated by the first laser gain unit 11 and the second laser gain unit 12 are overlapped partially, and the spectrums of laser beams generated by the second laser gain unit 12 and the third laser gain unit 13 are overlapped partially. It should be noted that, in other embodiments of the invention, the number of the laser gain units can be adjusted according to actual requirements, which will not be repeated here.

The shaping optical system 2 is used for optical shaping the laser beams generated by the laser gain medium array 1. Specifically, in the embodiment shown in FIG. 1, the shaping optical system 2 comprises a fast axis collimating lens 21, a field flattening lens 22, a negative lens 23 and a cylindrical lens 24. The fast axis collimator lens 21 is arranged at the emergent side of the laser gain medium array 1; the field flattening lens 22 is arranged at the emergent side of the fast axis collimator lens 21, the field flattening lens 22 is used for correcting the field curvature of the shaping optical system 2.

The negative lens 23 is arranged at the emergent side of the field flattening lens 22. The negative lens 23 is used for magnifying the dispersing angle of the light returning back from the dispersing optical unit.

The cylindrical lens 24 is arranged at the emergent side of the negative lens 23, and collimates the laser beams. The laser beams collimated by the cylindrical lens 24 emit towards the dispersing optical unit 3. Then, the shaping optical system 2 comprised by the field flattening lens 22, the negative lens 23 and the cylindrical lens 24 can shorten the length of whole optical path of the laser array beam combining device, lower the requirements for precision adjustment of laser device, and enhance the stability of laser devices.

The dispersing optical unit 3 is arranged at the emergent side of the shaping optical system 2, and diffracts incident laser beams. Specifically, as shown in FIG. 1, the dispersing optical unit 3 receives and diffracts the laser beams emitted out by the cylindrical lens 24 of the shaping optical system 2. Wherein, the laser beams emitted out by the cylindrical lens 24 may coincide at the place where the dispersing optical unit 3 is. In the embodiment in FIG. 1, the dispersing optical unit 3 can be a diffraction grating, and the diffraction grating can be a transmissive grating or a reflective grating. However, in some other embodiments, the dispersing optical unit 3 can also be a lens to realize similar effect as that of the diffraction grating, which will not be repeated herein.

The partial reflection unit 4 receives the laser beams which is diffracted and emitted out by the dispersing optical unit 3, and then emits it out. Preferably, the partial reflection optical unit 4 is a reflection mirror with coated with a medium film. Wherein, the partial reflection optical unit 4, together with the above laser gain medium array 1, shaping optical system 2 and dispersing optical unit 3, forms a laser resonant cavity.

In this embodiment, as the shaping optical system of the laser array combining device comprises a fast axis collimating lens, a field flattening lens, a negative lens and a cylindrical lens, the shaping optical system can shorten the length of whole optical path, and increase the precision of adjustment and the output stability of laser beams. The laser beams emitted out by the shaping optical system are refracted by a dispersing optical unit, which can improve the beam quality. On the other hand, the spectrum of each laser gain unit can be overlapped to narrow the spectrum of the combined beams.

The Second Embodiment

Figure 2:
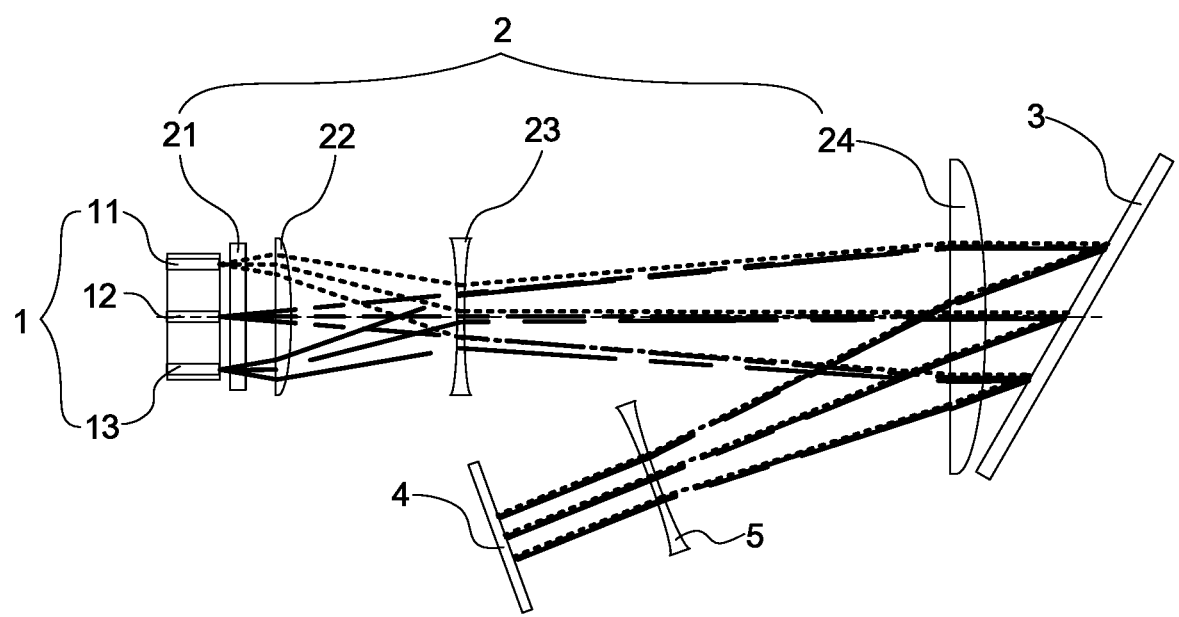
FIG. 2 is a structure schematic view of the laser array combining device according to a second embodiment of present invention.

Please refer to FIG. 2, which shows a structure schematic view of the laser array combining device according to the second embodiment of present invention. The differences of the second embodiment from the first embodiment shown in FIG. 1 are as follows. The dispersing optical unit 3 is arranged at a place near the cylindrical lens 24 of the shaping optical system 2, which allows the laser beams diffracted by the dispersing optical unit 3 to pass through the cylindrical lens 24 again and then to emit towards the partial reflection optical unit 4. Also, in this embodiment, the laser array beam combining device further comprises a concave lens 5. The concave lens 5 is arranged at the incident side of the partial reflection optical unit 4. Specifically, as shown in FIG. 2, the dispersing optical unit 3 is arranged at a place near the cylindrical lens 24, the laser beams from the cylindrical lens 24 towards the dispersing optical unit 3 may emit to the emergent side of the cylindrical lens 24 again after being diffracted by the dispersing optical unit 3, and then emit towards the concave lens 5 after passing through the cylindrical lens 24. The concave lens 5 can collimate the laser beams focused by the cylindrical lens 24, and the laser beams collimated by the concave lens 5 may emit towards the partial reflection optical unit 4, and then be emitted out by the partial reflection optical unit 4. This embodiment can realize the similar effect with the above first embodiment, and in addition, as the dispersing optical unit 3 is arranged a place near the cylindrical lens 24 of the shaping optical system 2 in this embodiment, the optical path is folded, which makes the structure of the laser array beam combining device more compact, and the overall volume smaller. Other effects similar with that of the first embodiment will not be repeated herein.

The Third Embodiment

Figure 3:
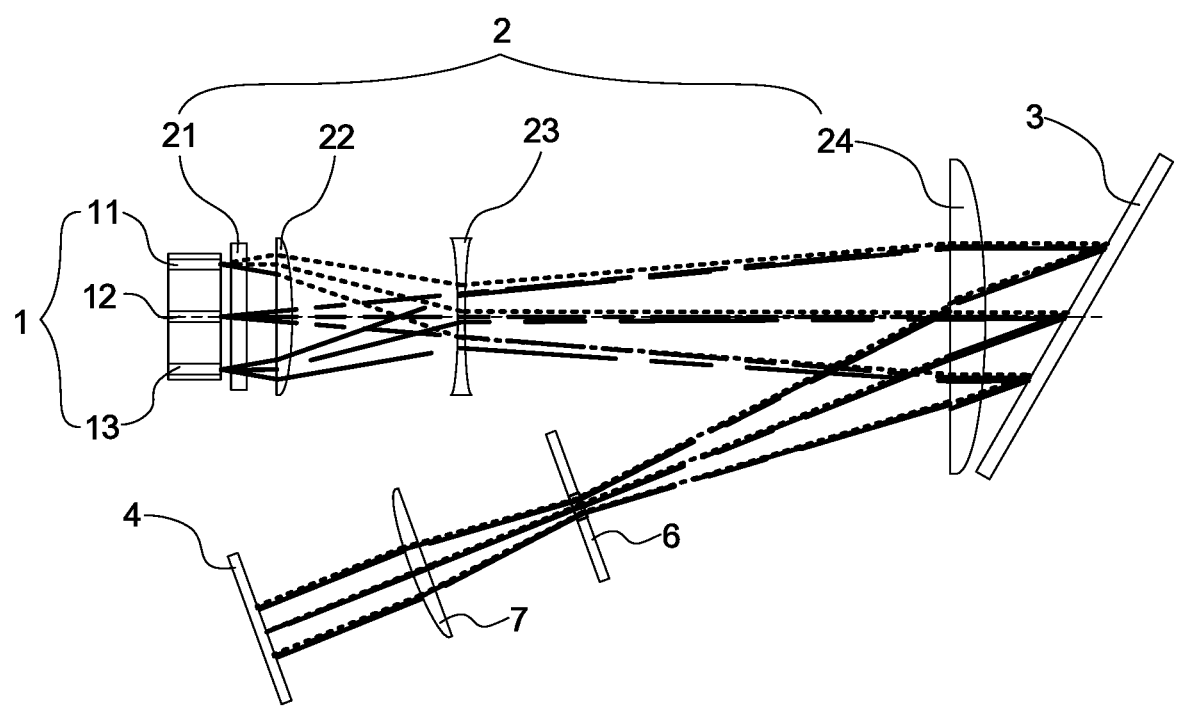
FIG. 3 is a structure schematic view of the laser array combining device according to a third embodiment of present invention.

Please refer to FIG. 3, which shows a structure schematic view of the laser array combining device according to the third embodiment of present invention. The differences of the third embodiment from the first embodiment shown in FIG. 1 are as follows. The dispersing optical unit 3 is arranged at a place near the cylindrical lens 24 of the shaping optical system 2, which allows the laser beams diffracted by the dispersing optical unit 3 to emit towards the partial reflection optical unit 4 after passing through the cylindrical lens 24. The laser array beam combining device further comprises a spatial filter 6 and a collimating lens 7. The collimating lens 7 is arranged at the incident side of the partial reflection optical unit 4, the spatial filter 6 is arranged at the incident side of the collimator lens 7. Specifically, as shown in FIG. 3, the dispersing optical unit 3 is arranged at a place near the cylindrical lens 24, the laser beams from the cylindrical lens 24 towards the dispersing optical unit 3 may emit towards the emergent side of the cylindrical 24 again after being diffracted by the dispersing optical unit, and then emit towards the spatial filter after passing through the cylindrical lens 24. Wherein, the spatial filter 6 is preferably arranged at the coincident point of the laser beams. The spatial filter 6 filters the laser beams passing by, so as to improve the beam quality. The laser beams filtered by the spatial filter 6 may emit towards the collimating lens 7, and then emit towards the partial reflection optical unit 4 after being collimated by the collimating lens 7, and finally be emitted out by the partial reflection optical unit 4. The embodiment can realize similar effects with that of the abovementioned second embodiment, and in addition, the spatial filter 6 filters the laser beams in this embodiment, which increases the beam quality of the beams emitted from the laser array beam combining device. Other effects similar with that of the first embodiment will not be repeated herein.

In conclusion, the embodiments of the present invention disclose a laser array combining device, of which the shaping optical system comprises a fast axis collimating lens, a field flattening lens, a negative lens and a cylindrical lens, and can shorten the length of whole optical path, lower the requirement for precision adjustment of laser device, and increase the output stability of laser beams. The laser beams emitted out by the shaping optical system are refracted by a dispersing optical unit and then fed back by a partial reflection optical unit, so as to form a resonant cavity, and finally output combined beams, which improves the beam quality effectively.

The present invention has been disclosed by the preferred embodiments as above, however, the preferred embodiments are not used to limit the scope of the present invention. The technicians in the art to which the present invention pertains, can make various changes or modifications without departing from the spirit and scope of present invention. So, the protection scope of present invention is subject to the scope defined by the claims.

What is claimed is:

1. A laser array combining device, wherein, the laser array combining device comprises:
   a laser gain medium array, the laser gain medium array comprising at least two laser gain units, and each the laser gain unit generating a laser beam;
   a shaping optical system, for optically shaping the laser beams generated by the laser gain medium array, the shaping optical system comprising:
   a fast axis collimating lens, arranged at an emergent side of the laser gain medium array;
   a field flattening lens, arranged at an emergent side of the fast axis collimating lens, for correcting the field curvature of the shaping optical system;
   a negative lens, arranged at an emergent side of the field flattening lens; and
   a cylindrical lens, arranged at an emergent side of the negative lens, for collimating the laser beams;
   a dispersing optical unit, arranged at an emergent side of the shaping optical system, for diffracting incident laser beams; and
   a partial reflection optical unit, receiving laser beams emitted by the dispersing optical unit;
   wherein the dispersing optical unit is also disposed at a place near to the cylindrical lens and the diffracted laser beams, passing through the cylindrical lens again, are then emitted to the partial reflection optical unit;
   wherein the laser array beam combining device further comprises a concave lens, the laser beams which have been diffracted by the dispersing optical unit emit towards the concave lens after passing through the cylindrical lens, and then emit towards the partial reflection optical unit after passing through the concave lens.

2. The laser array combining device according to claim 1, wherein, the dispersing optical unit is arranged at a place near the cylindrical lens, the laser beams which have been diffracted by the dispersing optical unit emit towards the partial reflection optical unit after passing through the cylindrical lens again;

the laser array combining device further comprises a spatial filter and a collimating lens, the laser beams which have been diffracted by the dispersing optical unit emit towards the spatial filter after passing through the cylindrical lens, and then shoot towards the collimator lens after being spatial filtered by the spatial filter, and emit towards the partial reflection optical unit after passing through the collimating lens.

3. The laser array combining device according to claim 1, wherein, the dispersing optical unit is a diffraction grating.

4. The laser array combining device according to claim 3, wherein, the diffraction grating is a transmissive grating or a reflective grating.

5. The laser array combining device according to claim 1, wherein, the dispersing optical unit is a lens.

6. The laser array combining device according to claim 1, wherein, the laser gain medium array is a semiconductor laser array.

7. The laser array combining device according to claim 1, wherein, in the laser gain medium array, the spectrums of laser beams generated by two adjacent laser gain units are overlapped partially.

8. The laser array combining device according to claim 1, wherein, the partial reflection optical unit is a reflection mirror coated with a medium film.

* * * * *